Figure 1:
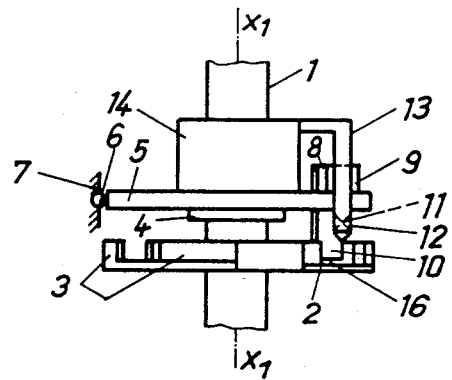

United States Patent [19]

Johannes et al.

[11] Patent Number: 4,791,365
[45] Date of Patent: Dec. 13, 1988

[54] POSITION RESPONSIVE CONTROL SIGNAL GENERATOR HAVING RELATIVELY MOVABLE SENSOR AND MAGNETIC FLUX CONCENTRATORS

[75] Inventors: Peter Johannes; Lutz Lampe; Wolfgang Lampe; Uwe Loreit, all of Hermsdorf; Gottfried Neumärker, Bad-Klosterlausnitz; Peter Pertsch, Hermsdorf, all of German Democratic Rep.

[73] Assignee: Kombinat VEB Keramische Werke Hermsdorf, Hermsdorf, Fed. Rep. of Germany

[21] Appl. No.: 898,283

[22] Filed: Aug. 20, 1986

[30] Foreign Application Priority Data

Sep. 27, 1985 [DD] German Democratic Rep. ... 281115

[51] Int. Cl.[4] .......... G01B 7/14; G01B 33/02; F02P 7/00; H01L 43/08
[52] U.S. Cl. .................. 324/208; 324/252; 338/32 R; 123/617
[58] Field of Search .......... 324/207, 208, 252, 235; 338/32 R; 123/617, 146.5 A; 310/154, 155, 168

[56] References Cited

U.S. PATENT DOCUMENTS

| 3,675,636 | 7/1972 | Hini | 123/617 |
| 3,947,711 | 3/1976 | Presely et al. | 310/168 |
| 3,955,166 | 5/1976 | Moore | 123/617 |
| 4,204,158 | 5/1980 | Ricouard et al. | 324/208 |

Primary Examiner—Reinhard J. Eisenzopf
Assistant Examiner—Walter E. Snow
Attorney, Agent, or Firm—Jordan and Hamburg

[57] ABSTRACT

Control signals are provided by means of a magnet, a sensor sensitive to magnets, and elements influencing the magnetic field and having a relative movement. A magnetoresistive circuit is placed between one stationary and at least two simultaneously linear or circular movable magnetic flux concentrators having an U- or V-shaped arrangement and being alternately effective in the magnetic circuit. The magnetoresistive circuit is operated in its saturation range, if at least one of the magnetic flux concentrators is effective.

5 Claims, 1 Drawing Sheet

POSITION RESPONSIVE CONTROL SIGNAL GENERATOR HAVING RELATIVELY MOVABLE SENSOR AND MAGNETIC FLUX CONCENTRATORS

FIELD OF THE INVENTION

This invention relates to an arrangement for providing control signals by means of a magnet, a sensor being arranged in and sensitive to the magnetic field, and elements influencing the magnetic field. The magnet and the sensor on the one hand and some of the elements influencing the magnetic field on the other hand are movable relative to each other and form a magnetic yoke. The invention can be used to control or measure angles or lengths. It is of particular importance for the control of the firing point in internal combustion engines.

BACKGROUND OF THE INVENTION

There are already known positioning devices, in which a magnetic field, alternating in its flux density due to positional changes, generates an electrical signal proportional to the flux density in a sensor, permitting the localization of the part to be positioned. These positioning devices allow not only a linear, but also a circular localization. In particular, in the case of internal combustion engines it is common practice to introduce a diaphragm ring between the poles of a magnet and, thus, to change alternately the magnetic flux density, or to make an annular magnet, having an alternating reversed polarity at its periphery, interact with a Hall sensor to generate the signals for the firing point of each cylinder. In these known devices the external magnetic fields, the temperature variations, and the manufacturing and mounting errors have a diminishing effect on the accuracy. Besides, the diaphragm ring is to be made of a special material with high permeability. The magnetic field only varies from a maximum value to a rectified minimum value, which makes high demands on the strength of the magnet. In the signal generators being fitted with Hall sensors and annular magnets, the controls of the switching threshold of the Hall sensors, the spacing tolerances between the annular magnet and the Hall sensor, and the controls of the annular magnet due to its manufacture and the bearing defects of the camshaft can not be taken into account much enough or only by special precautions.

SUMMARY OF THE INVENTION

It is an object of the invention to obviate the above mentioned shortcomings in an arrangement for providing control signals. Another object of the invention is to combine a higher sensitivity with material economy, temperature insensitivity within a large range, and a reduction of the dependence of the external influences.

A further object of the invention is to use a special sensor type and a new design of the magnetic yoke. According to the present invention these objects are attained in a way, that the sensor is designed as a magnetoresistive circuit, the magnetic flux is influenced at least by three magnetic flux concentrators, one of which is in a fixed position to the sensor and, together with the sensor, it is substantially located on one straight line, preferably at right angles to the movement direction, and the other two of the magnetic flux concentrators are staggered parallel to both sides of a first plane or cylindrical face, which is determined by the direction of the relative movement and the straight line. The edges of the other two magnetic flux concentrators facing each other at least nearly lie in a second plane or cylindrical face, having a rectangular position to the first one, and substantially are located symmetrically to the first plane or cylindrical face. The sensor operates in its saturation range, if the one magnetic flux concentrator interacts with at least one of the other two magnetic flux concentrators in each case.

The circuit can be designed not only as a bridge circuit with four variable resistors, but also as a half-bridge circuit with an additional electronics. The circuit can also be fitted with further components serving for signal processing and recognition. The use of magnetic flux concentrators and the magnetoresistive circuit allows overloading this circuit, to apply it in the saturation range, and, thus, to eliminate the effect of disturbing magnetic fields. For the advantageous arrangement the straight line has a rectangular position to the direction of the relative movement, and the other two magnetic flux concentrators are arranged in a way, that the magnetic flux lines between the sensor and the respective one of the other two magnetic flux concentrators in each case change their direction preferably by 90° when going over from the one magnetic flux concentrator to the respective other. Thus, the two other magnetic flux concentrators are effective at the moment of changing in direction.

Advantageously the one magnetic flux concentrator and the sensor are placed at the stator, and the other two magnetic flux concentrators at the rotor of an ignition distributor, and, thus, the edges facing each other are located in or near the same diametrical plane.

Due to the concentration of the magnetic field, the operation of the sensor in the saturation range, and the appropriate dimensioning of the magnet it is advantageous, if the one magnetic flux concentrator close to the sensor has an edge or a point. In this connection it is also possible, that the one magnetic flux concentrator is constructed as a pole shoe of the magnet, or that the other two magnetic flux concentrators are a magnet pole shoe of appropriate design and arrangement. The magnetic yoke magnetically connects the magnetic pole, being turned off relating to the sensor, to the other two magnetic flux concentrators, a narrow gap ensuring the relative movement between the sensor with the one magnetic flux concentrator and the other two magnetic flux concentrators.

In a favourable embodiment of the invention the other two magnetic flux concentrators form an open angle, in or near the opening of which the sensor is arranged. Another suitable embodiment is characterized in that the other two magnetic flux concentrators are designed as sides of an U-shaped component, and the sensor is arranged in or near the opening of the U-shaped component, so that a change in direction of the concentrated magnetic flux preferably by 90° is caused by switching over the field direction from one of the two magnetic flux concentrators to the other. Instead of the other two magnetic flux concentrators it is also possible to arrange in pairs a few magnetic flux concentrators, the magnetic flux concentration of each pair showing an unequal extension in parallel to the movement direction.

BRIEF FIGURE DESCRIPTION

Figure 2:
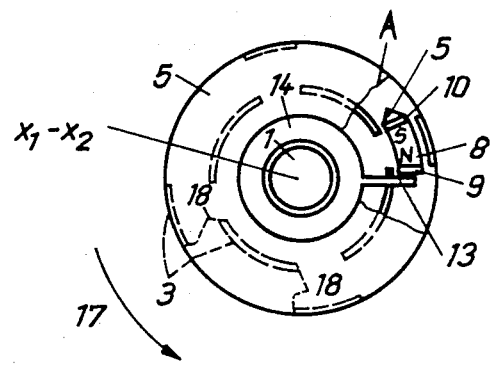
Figure 3:
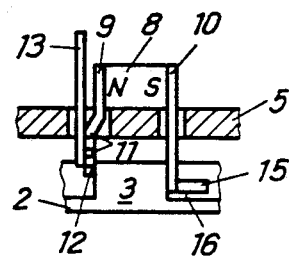
Figure 4:
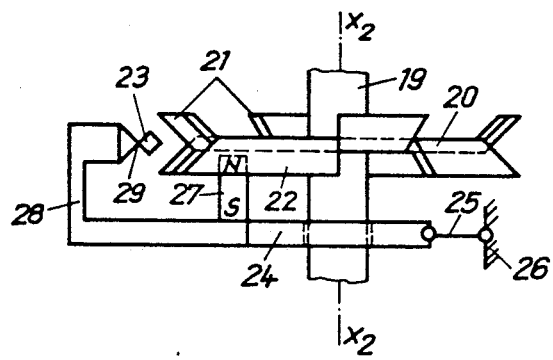

Two examples of the invention are particularly described with reference to the accompanying schematic drawings, wherein FIG. 1 shows a front view of a first embodiment, FIG. 2 shows a plan view of the first embodiment being presented with a section A, FIG. 3 shows a section A being magnified, and FIG. 4 shows the front view of a second embodiment.

DETAILED DISCLOSURE

In the FIGS. 1 to 3 a segment disk 2 made of ferromagnetic material with magnetic flux concentrators 3 being staggered about an axis $X_1$—$X_1$ is attached to a shaft 1 which is rotable around an axis $X_1$—$X_1$. A flange 4 of the shaft 1 carries a supporting disk 5 which is made of unmagnetizable material and is parallel to the segment disk 2. The disk 5 is adjustably connected to a stationary part 7 of a device (not shown) via a coupling unit 6 and does not participate in the rotation of the shaft 1. On the supporting disk 5 a permanent magnet 8 is fixed with north-south polarity, having in its pole faces the lugs 9, 10, both being cranked at their free ends and extending with these ends through the supporting disk 5. At its free end the lug 9 is wedge-shaped with an edge 11 and, thus, it is constructed as a magnetic flux concentrator. A magnetoresistive sensor (circuit) 12 is arranged directly in front of the edge 11 and is rigidly connected via an angled arm 13 with a bush 14 fixed to the supporting disk 5. The angled arm 13 and the bush 14 are made of unmagnetizable material, too. The lug 10 with its free end is placed between the magnetic flux concentrators 3 in a way, that a close flux gap 16 is formed, which slightly influences the magnetic yoke. In the FIG. 2 the direction of rotation of the segment disk 2 for a relative circular movement between the magnetic flux concentrators 3 and the sensor 12 as well as the lug 9 serving as a magnetic flux concentrator is marked by an arrow 17.

While rotating the shaft 1 with the segment disk 2 in the direction of the arrow 17 the magnetic flux concentrators 3 move on paths, having U-shaped cross sections at the position, where the one magnetic flux concentrator 9 and the sensor 12 meet the segment disk 2. Thereby the one magnetic flux concentrator 9 and the sensor 12 are essentially in a straight line extending perpendicularly to the relative movement marked by the arrow 17. Regarding the tangent plane or cylindrical face determined by the straight line and the relative circular movement, the adjacent edges 18 of two successive magnetic flux concentrators 3 fixed on the segment disk 2 are arranged symmetrically. Regarding the segment disk 2 the respective adjacent edges are located in or near the same diameter plane. In accordance with this specification the tangent plane or cylindrical face and the respective diameter plane are arranged as first and second planes at right angles to each other. The magnetic circuit starts from the north pole of the magnet 8 via the pole piece 9 with the wedge-shaped free end, concentrating the magnetic flux upon the sensor 12, to the internal or external one of the other magnetic flux concentrators 3, and via the segment disk 2, the flux gap 16, the pole piece 10 to the south pole. Due to the high concentration of the magnetic flux the magnetoresistive circuit 12 is always in the saturation range, and it only responds to the change in direction of the magnetic flux, which comes about, when the magnetic flux, being in relative movement, jumps from an external magnetic flux concentrator 3 to an internal one or vice versa. Thereby the magnetic flux changes its direction approximately by 90°, that means from +45° to −45° with respect to the tangent plane or cylindrical face.

In FIG. 4 a shaft 19 is rigidly connected to a segment disk 20 made of ferromagnetic material and is pivoted around an axis $X_2$—$X_2$. The segment disk 20 is fitted with peripheral magnetic flux concentrators 21, 22, which are alternately bent up and down and symmetrically out of the plane of the segment disk 20 in V-shaped manner. In the V opening a magnetoresistive circuit 23 is arranged, being alternately equidistant from the magnetic flux concentrators 21, 22 during the rotation of the segment disk 20. On the shaft 19, there is also arranged an unmagnetized supporting disk 24, which via a coupling unit 25 is connected to a stationary part of the device in an adjustable manner and which is, therefore, not affected by the rotation of the shaft 19. The supporting disk 24 carries the sensor 23 and, separated therefrom, a magnet 27 with the yoke 28, ending opposite to the sensor 23 in a point and serving with this point as a magnetic flux concentrator. The magnetic flux concentrator 29 and the sensor 23 are arranged on a straight line extending perpendicular to the relative movement of the segment disk 20 and forming with this a first plane, on which the second plane or cylindrical face, determined by the adjacent edges of the successive other magnetic flux concentrators 21, 22, has a perpendicular position.

Also in this case the magnetic flux concentration allows the sensor 23 to remain in the saturation range. The rotation of the shaft 19 with the segment disk 20 and the different positions of the magnetic flux concentrators 21, 22 cause a change in direction of the magnetic flux, which is transformed by the sensor 23 to an electrical signal, serving as a control signal for means not shown and described.

In the embodiments of the invention the two other magnetic flux concentrators have different lengths. However, it is possible to construct them with equal lengths. Also linear other magnetic flux concentrators fall in the scope of the invention.

We claim:

1. A generator for the production of position-dependent position signals with a magnet to produce a magnetic flow, said generator comprising a magnetic circuit including a magnet, a magnetoresistive sensor, and first, second and third magnetic flow concentrators, means for providing relative movement between said sensor with respect to said first concentrator and said second and third concentrators, to alternately direct magnetic flux between said first concentrator and said second and third concentrators, respectively, upon said relative movement, said second and third concentrators being mounted to extend parallel to the relative movement and staggered at opposite sides of said sensor and said first concentrator, said second and said third concentrators having respective edges spaced from one another, the respective edges of said second and third concentrators being symmetrical to said sensor and said first concentrator and spaced at right angles to said relative movement, the first concentrator being on a side of said sensor facing away from said second and third concentrators, means for holding said sensor in the path of flux between said first concentrator and said second and third concentrators, said magnet being mounted to maintain a substantially constant magnetic flow between said first concentrator and said second and third concentrators of sufficient magnitude to continuously maintain magnetic saturation in said sensor when the flux is switched between said second and third flow concentrators upon said relative movement, said second and third concentrators being positioned to effect a substantially 90° change in direction of the magnetic flux when the flux is switched between said second and third flow concentrators upon said relative movement.

2. The generator of claim 1 comprising a stator and a rotor, said first flow concentrator, sensor and magnet being mounted on said stator, said second and third flow concentrators being mounted on said rotor.

3. The generator of claim 2 wherein said first flow concentrator has a tip or an edge adjacent said sensor.

4. The generator of claim 3 wherein said second and third flow concentrators define an open angle, said sensor being positioned within or close to the opening of said open angle.

5. The generator of claim 3 wherein said second and third flow concentrators are formed as the arms of a U-shaped component and said sensor is mounted to be within or close to the opening of the U-shaped component.

* * * * *

UNITED STATES PATENT AND TRADEMARK OFFICE
CERTIFICATE OF CORRECTION

PATENT NO.  : 4,791,365
DATED       : December 13, 1988
INVENTOR(S) : Peter Johannes et al It is certified that error appears in the above-identified patent and that said Letters Patent is hereby corrected as shown below:

Title page:

Please change

[73] Kombinat VEB Keramische Werke
     Hermsdorf, Hermsdorf, Fed. Rep.
     of Germany to

[73] Kombinat VEB Keramische Werke
     Hermsdorf, Hermsdorf, German
     Democratic Republic

Signed and Sealed this

Twentieth Day of February, 1990

Attest:

JEFFREY M. SAMUELS

*Attesting Officer*     *Acting Commissioner of Patents and Trademarks*